(12) United States Patent
Holt et al.

(10) Patent No.: US 11,869,958 B2
(45) Date of Patent: Jan. 9, 2024

(54) HETEROJUNCTION BIPOLAR TRANSISTORS

(71) Applicant: GLOBALFOUNDRIES U.S. Inc., Malta, NY (US)

(72) Inventors: Judson R. Holt, Ballston Lake, NY (US); Shesh Mani Pandey, Saratoga Springs, NY (US); Vibhor Jain, Williston, VT (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/745,280

(22) Filed: May 16, 2022

(65) Prior Publication Data

US 2023/0369474 A1 Nov. 16, 2023

(51) Int. Cl.
*H01L 29/737* (2006.01)
*H01L 29/66* (2006.01)
*H01L 29/08* (2006.01)
*H01L 29/10* (2006.01)

(52) U.S. Cl.
CPC ...... *H01L 29/7371* (2013.01); *H01L 29/0804* (2013.01); *H01L 29/0821* (2013.01); *H01L 29/1004* (2013.01); *H01L 29/66242* (2013.01)

(58) Field of Classification Search
CPC ............ H01L 29/7371; H01L 29/0804; H01L 29/0821; H01L 29/1004; H01L 29/66242
See application file for complete search history.

(56) References Cited

U.S. PATENT DOCUMENTS

| 6,555,874 | B1 | 4/2003 | Hsu et al. |
| 6,706,583 | B1 * | 3/2004 | Comard ............ H01L 29/66242 |
| | | | 438/235 |
| 7,462,923 | B1 | 12/2008 | U'Ren |
| 7,566,921 | B2 | 7/2009 | Pagette |
| 8,441,084 | B2 | 5/2013 | Cai et al. |
| 9,437,718 | B1 | 9/2016 | Cai et al. |
| 9,502,504 | B2 | 11/2016 | Cai et al. |
| 9,748,369 | B2 | 8/2017 | Liu |
| 11,145,725 | B2 | 10/2021 | Liu et al. |
| 11,217,685 | B2 | 1/2022 | Ho et al. |
| 2004/0222436 | A1 | 11/2004 | Joseph et al. |

(Continued)

FOREIGN PATENT DOCUMENTS

JP H05175223 7/1993

OTHER PUBLICATIONS

Search Report in related EP Application No. 22200484.8-1212 dated May 26, 2023, 13 pages.

(Continued)

*Primary Examiner* — Syed I Gheyas
(74) *Attorney, Agent, or Firm* — Francois Pagette; Andrew M. Calderon; Calderon Safran & Cole P.C.

(57) ABSTRACT

The present disclosure relates to semiconductor structures and, more particularly, to heterojunction bipolar transistors and methods of manufacture. The structure includes: a collector in a semiconductor substrate; a subcollector in the semiconductor substrate; an intrinsic base over the subcollector; an extrinsic base adjacent to the intrinsic base; an emitter over the intrinsic base; and an isolation structure between the extrinsic base and the emitter and which overlaps the subcollector.

17 Claims, 10 Drawing Sheets

(56) References Cited

U.S. PATENT DOCUMENTS

| | | | |
|---|---|---|---|
| 2014/0217551 A1* | 8/2014 | Dunn | H01L 29/0821 716/101 |
| 2016/0190292 A1 | 6/2016 | Adkisson et al. | |
| 2017/0358608 A1 | 12/2017 | Verma et al. | |
| 2021/0091180 A1 | 3/2021 | Pekarik et al. | |
| 2021/0091213 A1 | 3/2021 | Jain et al. | |

OTHER PUBLICATIONS

Heinemann et al., "SiGe HBT with fx/fmax of 505 GHz/720 GHz," IEEE International Electron Devices Meeting (IEDM), 2010, 4 pages.

Böck et al., "SiGe HBT and BiCMOS process integration optimization within the DOTSEVEN project," 2015 IEEE Bipolar/BiCMOS Circuits and Technology Meeting—BCTM, 2015, Abstract, 2 pages.

Ning et al., "A perspective on SOI symmetric Lateral Bipolar Transistor for ultra-low-power systems", Electron Devices Society, Apr. 7, 2016, 10 pages.

Application and Drawings for U.S. Appl. No. 17/580,127, filed Jan. 20, 2022, 29 pages.

Koričić et al., "Double-Emitter Reduced-Surface-Field Horizontal Current Bipolar Transistor With 36 V Breakdown Integrated in BiCMOS at Zero Costar", IEEE Electron Device Letters, vol. 36, No. 2, Feb. 2015, 3 pages.

Suligoj et al., "Horizontal Current Bipolar Transistor With a Single Polysilicon Region for Improved High-Frequency Performance of BiCMOS ICs", IEEE Electron Device Letters, vol. 31, No. 6, Jun. 2010, 3 pages.

S. Van Huylenbroeck et al., "A 400GHz fMAX Fully Self-Aligned SiGe:C HBT Architecture", IEEE Bipolar/BiCMOS Circuits and Technology Meeting, 2009, 7 pages.

* cited by examiner

… (US 11,869,958 B2)

HETEROJUNCTION BIPOLAR TRANSISTORS

BACKGROUND

The present disclosure relates to semiconductor structures and, more particularly, to heterojunction bipolar transistors and methods of manufacture.

Bipolar transistors can be vertical transistors or lateral transistors. Vertical bipolar transistors can be used for many different types of applications, e.g., ranging from high performance applications to low performance applications. For example, bipolar transistors can be used in mm-wave power amplifiers and low noise amplifiers, automotive radars and optical interconnects.

Typically, heterojunction bipolar transistors are formed in bulk substrate or in a cavity touching a handle wafer for a semiconductor-on-insulator (SOI) substrate. To manufacture these devices, many complex and costly processing steps are required such as epitaxial growth processes and masking processes. These processes can be very repetitive during the fabrication processes leading to additional unwanted costs.

SUMMARY

In an aspect of the disclosure, a structure comprises: a collector in a semiconductor substrate; a subcollector in the semiconductor substrate; an intrinsic base over the subcollector; an extrinsic base adjacent to the intrinsic base; an emitter over the intrinsic base; and an isolation structure between the extrinsic base and the emitter and which overlaps the subcollector.

In an aspect of the disclosure, a structure comprises: a collector; a subcollector electrically connected to the collector; an intrinsic base over the subcollector; an extrinsic base adjacent to the intrinsic base; a hardmask between the collector and the extrinsic base; and an emitter over the intrinsic base.

In an aspect of the disclosure, a method comprises: forming in a single epitaxial growth processing pass: a collector in a semiconductor substrate; a subcollector in the semiconductor substrate; an intrinsic base over the subcollector; an extrinsic base adjacent to the intrinsic base; and an emitter over the intrinsic base; and forming an isolation structure between the extrinsic base and the emitter and which overlaps the subcollector.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to heterojunction bipolar transistors and methods of manufacture. More specifically, the heterojunction bipolar transistors may be self-aligned SiGe vertical heterojunction bipolar transistors with a subcollector, emitter and base regions manufactured in a single epitaxial growth process. Advantageously, the present disclosure provides a lower cost technology by reducing the number of epitaxial growth passes, while also reducing mask count.

In more specific embodiments, the heterojunction bipolar transistors include a subcollector, intrinsic base, extrinsic base, emitter and optional marker layer formed in a single epitaxial processing pass (e.g., step). The emitter and extrinsic base may be separated by a trench filled with dielectric material. In embodiments, the trench filled with the dielectric material may be between the emitter and the extrinsic base, in addition to straddling or overlapping the subcollector (e.g., N− subcollector region) and underlying hardmask. The trench filled with the dielectric material and the extrinsic base may be located over hardmask material. Moreover, in embodiments, the extrinsic base may be located above a SiGe marker layer. The SiGe marker layer may have a lower Ge concentration than the intrinsic base, as an example. The extrinsic base may also be laterally connected to the intrinsic base on a side.

The heterojunction bipolar transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the heterojunction bipolar transistors of the present disclosure have been adopted from integrated circuit (IC) technology. For example, the structures are built on wafers and are realized in films of material patterned by photolithographic processes on the top of a wafer. In particular, the fabrication of the heterojunction bipolar transistors uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
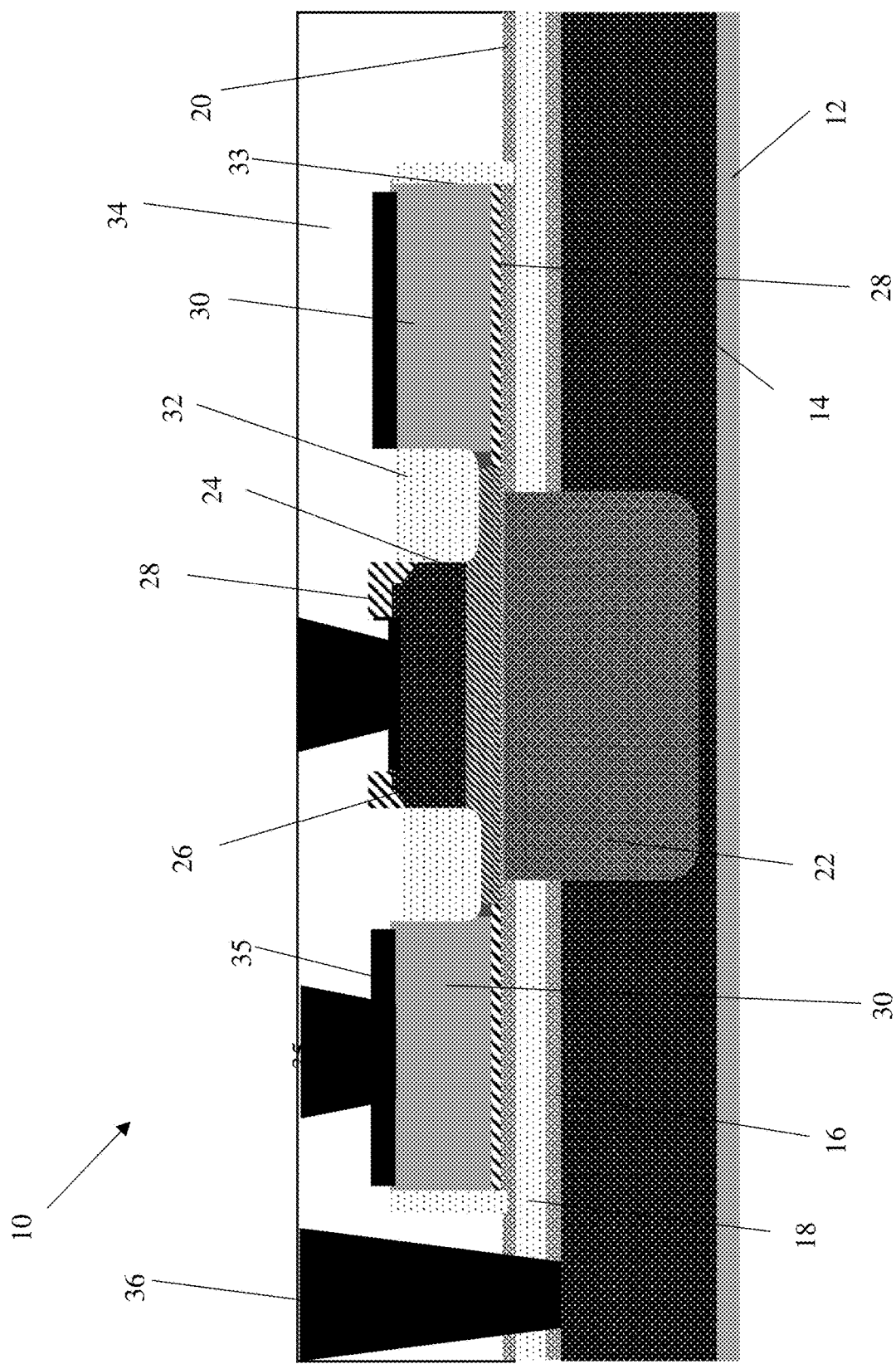
FIG. 1 shows a heterojunction bipolar transistor in accordance with aspects of the present disclosure.

FIG. 1 shows a heterojunction bipolar transistor in accordance with aspects of the present disclosure. The heterojunction bipolar transistor 10 includes a semiconductor substrate 12 with a subcollector 14. In embodiments, the semiconductor substrate 12 may be composed of any suitable semiconductor material including, but not limited to, Si, SiGe, SiGeC, SiC, GaAs, InAs, InP, and other III/V or II/VI compound semiconductors. In further embodiments, the semiconductor substrate 12 may be a p-substrate with any suitable crystallographic orientation (e.g., a (100), (110), (111), or (001) crystallographic orientation).

Figure 5A:
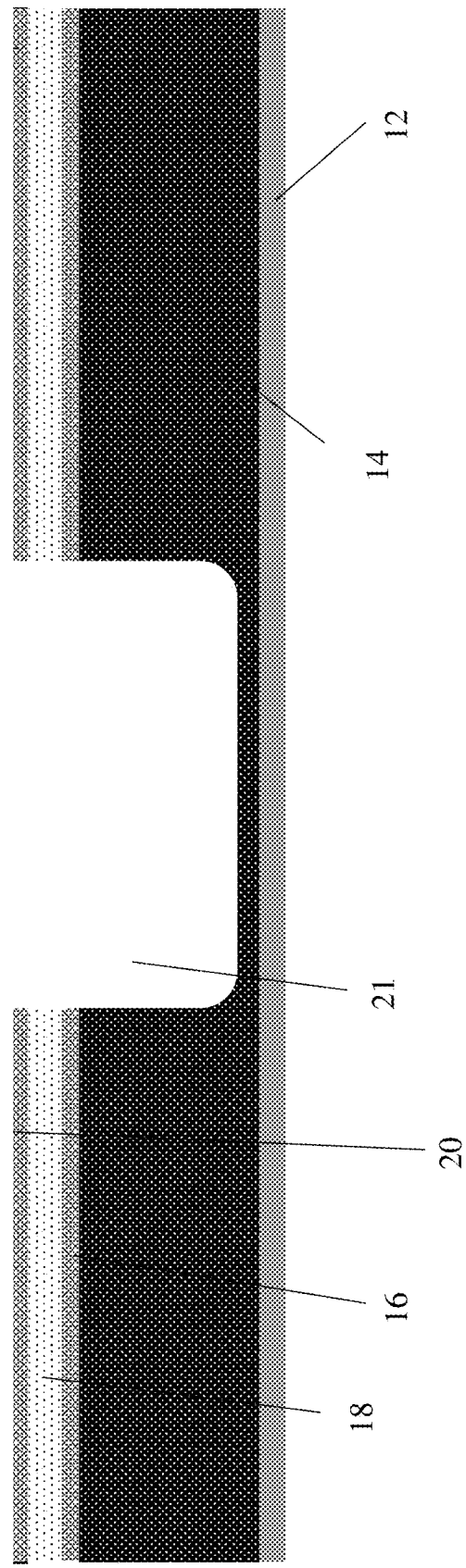
FIGS. 5A-5D show fabrication processes of forming the heterojunction bipolar transistors of FIGS. 1-3 in accordance with aspects of the present disclosure.

The subcollector 14 may be a highly doped N-type subcollector 14 formed by a conventional ion implantation process as is known in the art and described in more detail with respect to FIG. 5A. In embodiments, the subcollector 14 may be heavily doped with n-type dopants, e.g., Arsenic (As), Phosphorus (P) and Antimony (Sb), among other suitable examples.

Hardmask materials 16, 18, 20 may be formed over the subcollector 14. In embodiments, the hardmask materials 16, 20 may be nitride and the hardmask material 18 may be an oxide. In alternative embodiments, a single insulating material or any combination of dielectric materials described herein are contemplated for use as the hardmask. The hardmask materials 16, 18, 20 may be formed by conventional deposition methods, e.g., chemical vapor deposition (CVD) processes.

Still referring to FIG. 1, a collector 22 may formed within a trench extending into the subcollector 14 and hardmask materials 16, 18, 20. In this way, the collector 22 may be electrically connected to the subcollector 14. An intrinsic base 24 may be formed over the collector 22. In embodiments, the intrinsic base 24 may laterally extend over, e.g., overlap, the hardmask material 20. Also, an emitter 26 may be formed over the intrinsic base 24 with an optional marker layer 28 formed over the emitter 26 and the hardmask material 20. The emitter 26 may be N+Si material, as an example. In embodiments, the shape of the subcollector 14, intrinsic base 24 and the emitter 26 may be different. An extrinsic base 30 is formed on, e.g., directly contacting, the marker layer 28 and a side of the intrinsic base 24. To reduce processing steps and costs, the collector 22, intrinsic base 24, emitter 26, optional marker layer 28 and extrinsic base 30 may be formed in a single epitaxial growth pass (e.g., within the same processing chamber) as described in more detail with respect to FIG. 5B.

In specific embodiments, the collector 22 may be an N– subcollector composed of, e.g., lightly doped Si; whereas the intrinsic base 24 and the marker layer 28 may be SiGe material. The Ge concentration of the marker layer 28 may be less than the Ge concentration of the intrinsic base 24. For example, the Ge concentration of the marker layer 28 may be below 15% and, more preferably about 5%-15%, whereas the Ge concentration of the intrinsic base 24 may be above 15%. The emitter 26 may be N+ Si material.

Figure 5B:
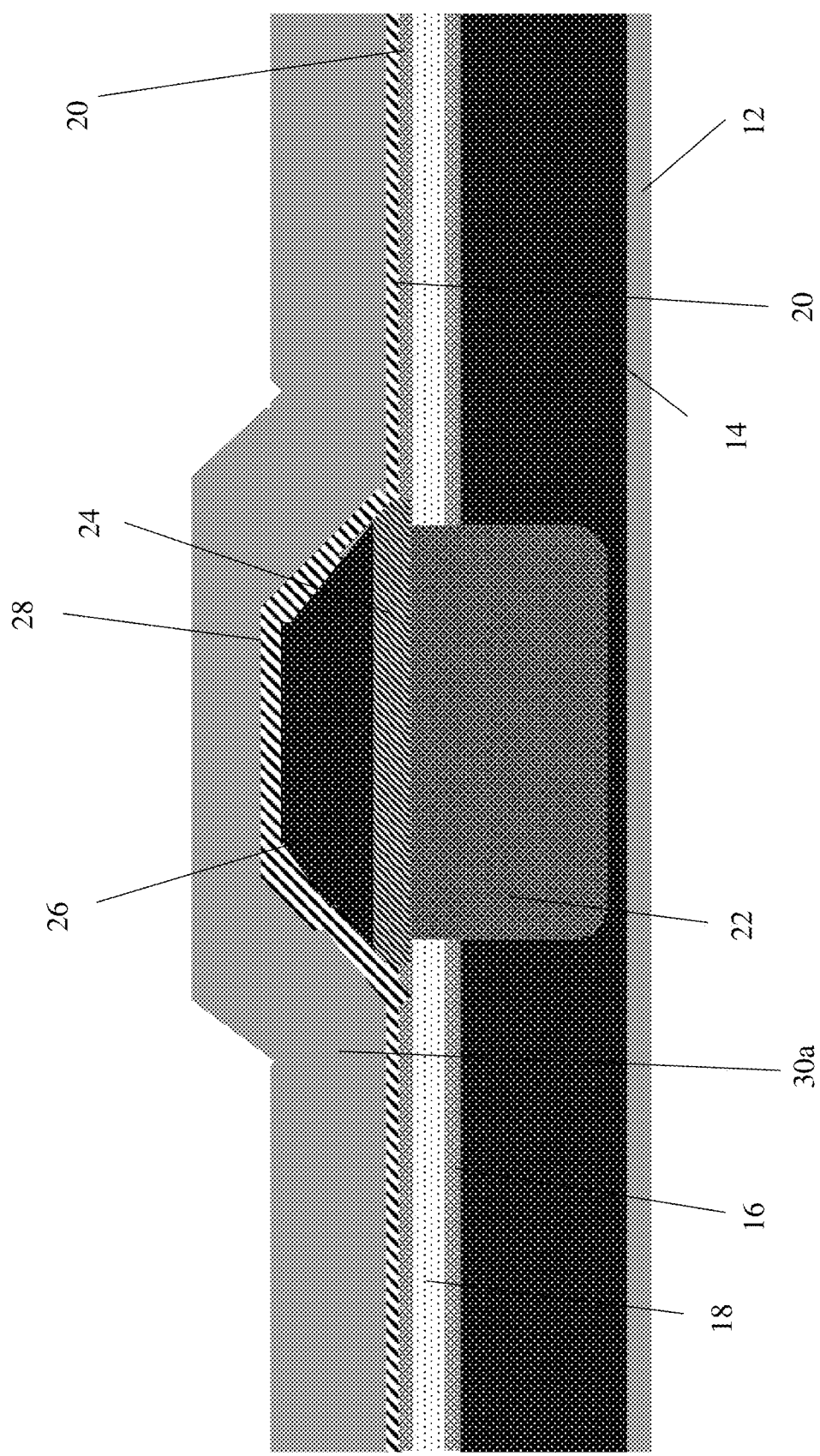
Figure 5C:
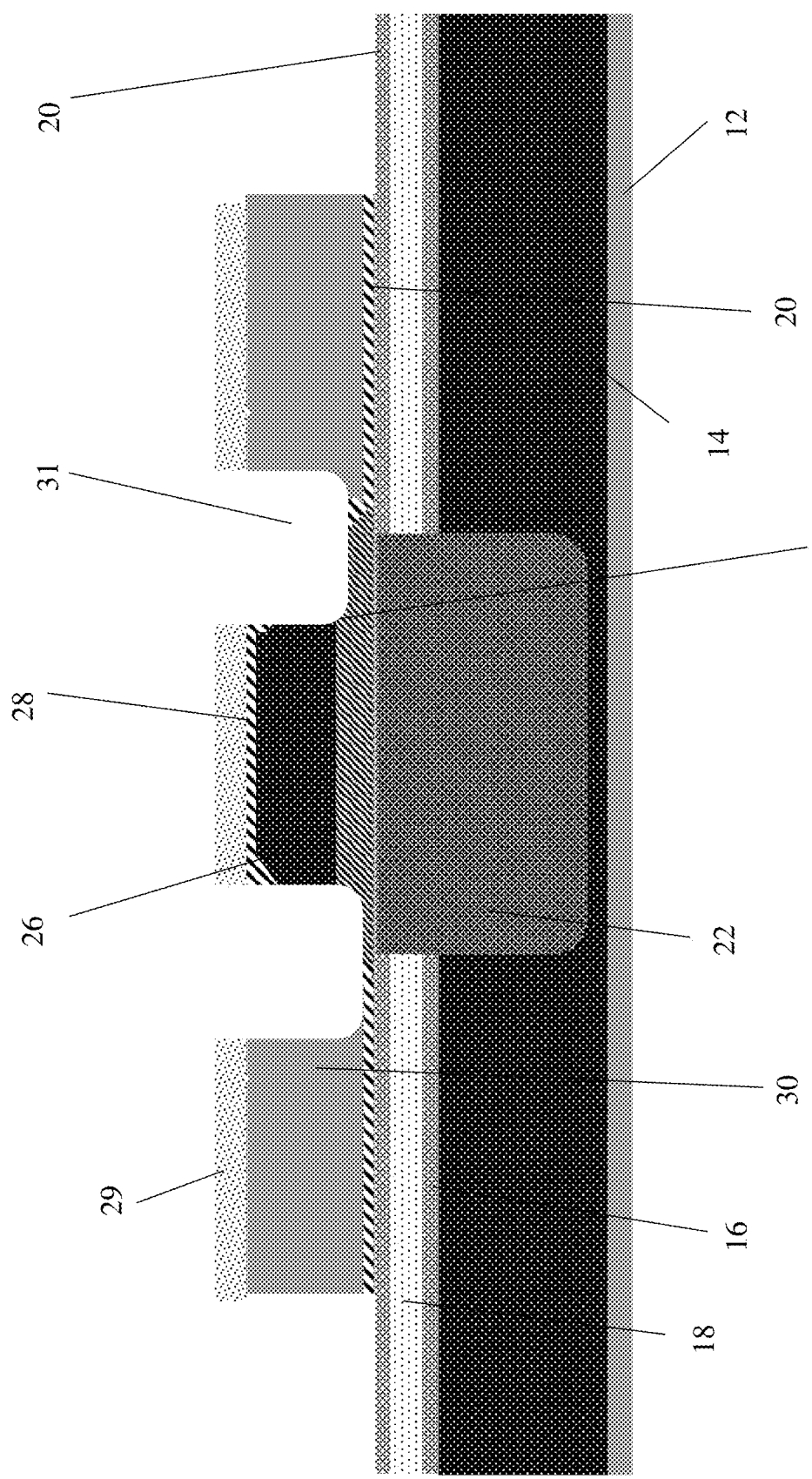

In embodiments, the extrinsic base 30 may be a polysilicon material and, more specifically, a P+ polysilicon material formed by an epitaxial growth process following by a patterning process as described in more detail with respect to FIGS. 5B and 5C. A trench filled with dielectric material 32 separates, i.e., electrically isolates, the extrinsic base 30 from the emitter 26. The trench filled with the dielectric material 32 straddles or overlaps the collector 22 and the hardmask material 20. Sidewall spacers 33 may be provided on the opposing sidewalls of the extrinsic base 30. In embodiments, the sidewall spacers 33 may be a same material as the dielectric material 32.

An interlevel dielectric material 34 may be formed, e.g., deposited, over the trench filled with dielectric material 32, extrinsic base 30, emitter 26 and optional marker layer 28. In embodiments, the interlevel dielectric material 34 may be alternating layers of oxide and nitride, as an illustrative example. Contacts 36 may be formed in (e.g., in trenches) the interlevel dielectric material 34 to the extrinsic base 30, subcollector 14 and emitter 26. Prior to forming the contacts 36, silicide contacts 35, e.g., NiSi, may be formed on the extrinsic base 30, subcollector 14 and emitter 26 as described in more detail in FIG. 5D.

Figure 2:
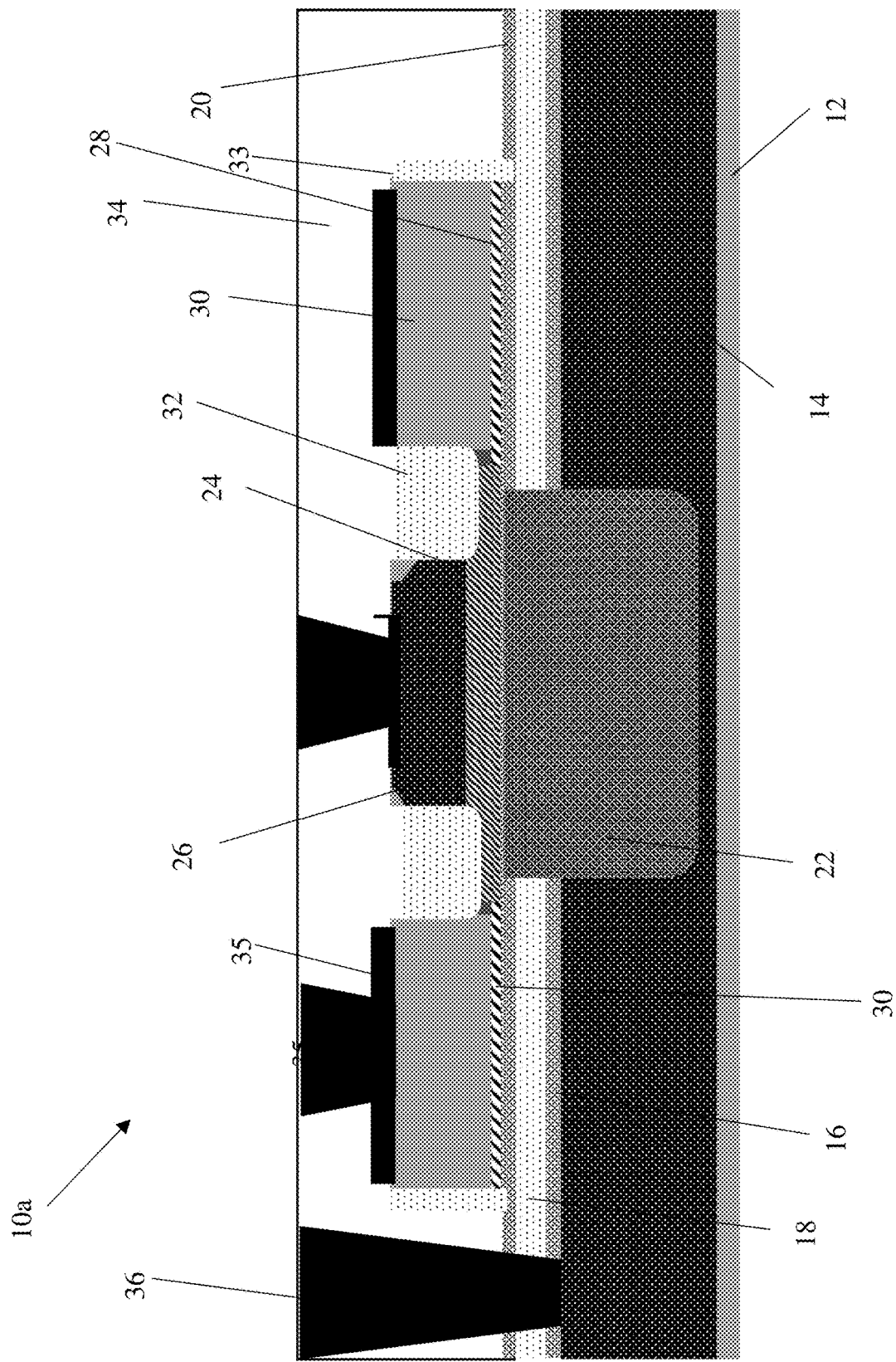
FIG. 2 shows a heterojunction bipolar transistor in accordance with additional aspects of the present disclosure.

FIG. 2 shows a heterojunction bipolar transistor 10a in accordance with additional aspects of the present disclosure. In the heterojunction bipolar transistor 10a of FIG. 2, the marker layer is removed from the upper surface of the emitter 26. The remaining features are similar to that already described with respect to FIG. 1.

Figure 3:
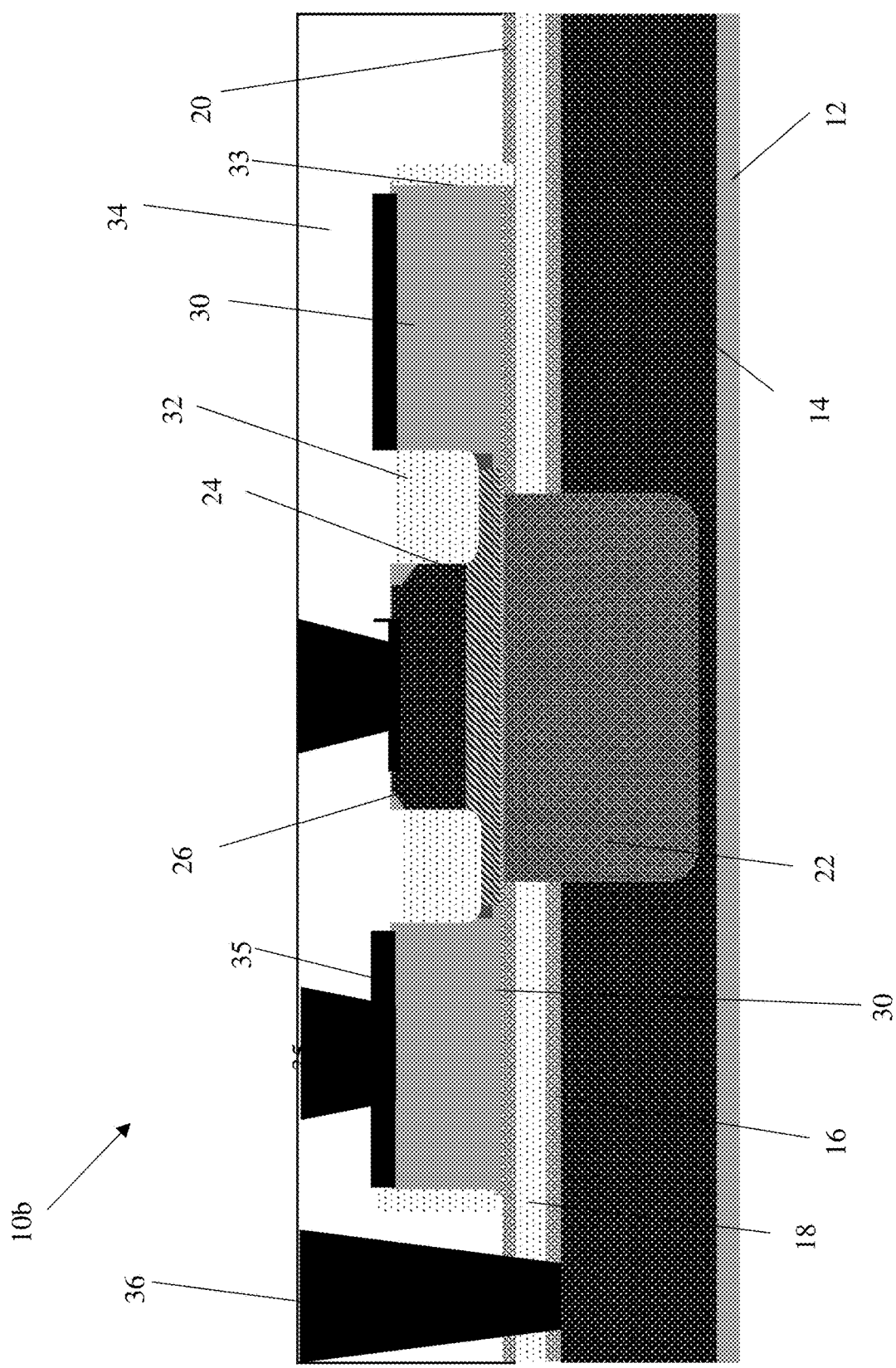
FIG. 3 shows a heterojunction bipolar transistor in accordance with another aspect of the present disclosure.

FIG. 3 shows a heterojunction bipolar transistor 10b in accordance with another aspect of the present disclosure. In the heterojunction bipolar transistor 10b of FIG. 3, the marker layer is removed from the upper surface of the emitter 26 and between the hardmask material 20 and the extrinsic base 30. The remaining features are similar to that already described with respect to FIG. 1.

Figure 4:
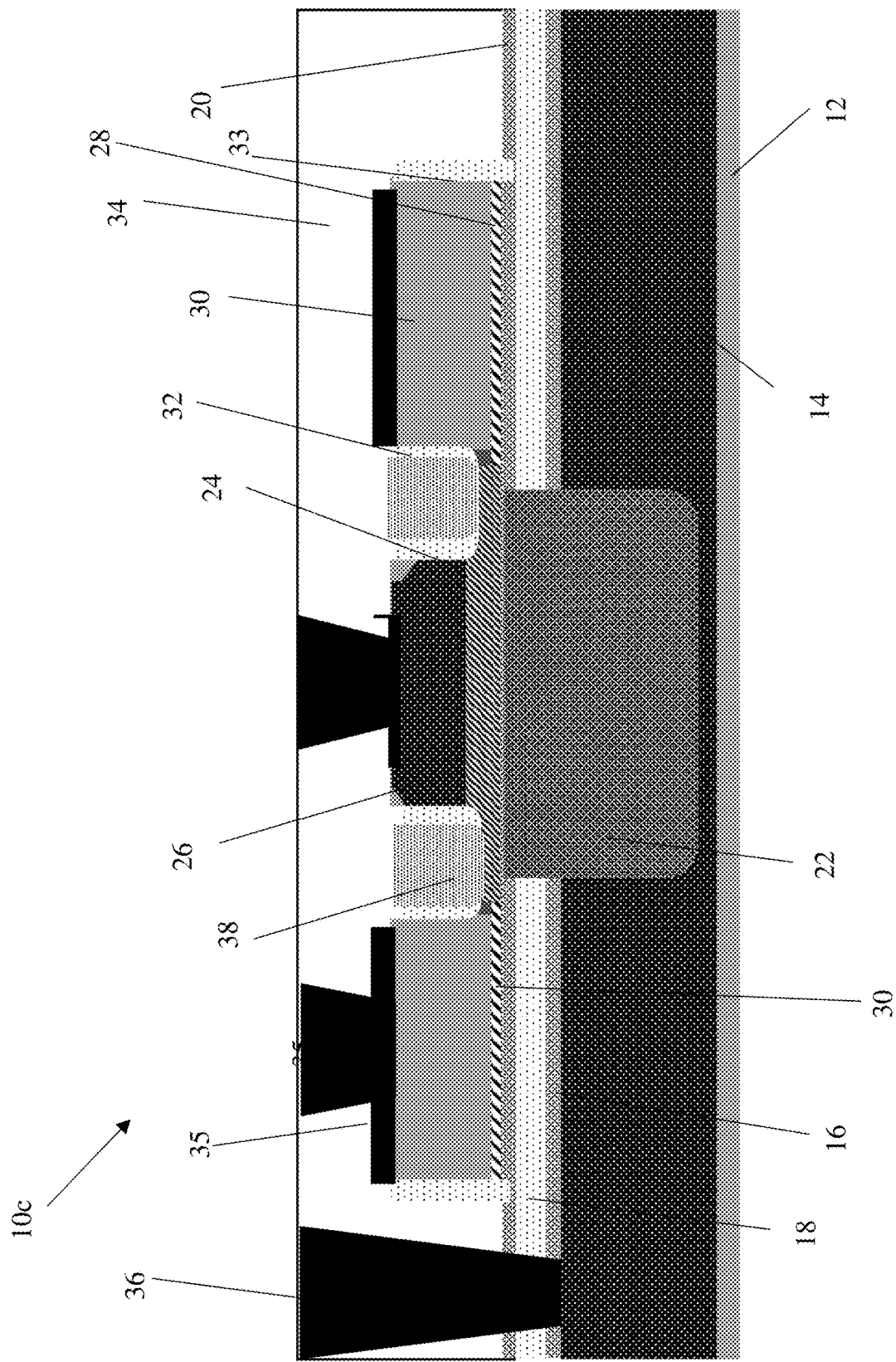
FIG. 4 shows a heterojunction bipolar transistor in accordance with yet additional aspects of the present disclosure.

FIG. 4 shows a heterojunction bipolar transistor 10c in accordance with yet additional aspects of the present disclosure. In the heterojunction bipolar transistor 10c of FIG. 4, dielectric material 32, 38 may be formed in the trench between the extrinsic base 30 and the emitter 26. The dielectric material 32, 38 may be oxide and a nitride, with either the oxide or nitride being a sidewall spacer on the emitter 26 and the extrinsic base 30, and the other material filling the remaining portion of the trench. Moreover, the intrinsic base 24 may be doped, e.g., p doped, under the dielectric material 38. In an optional embodiment, the marker layer 28 can also be removed from the upper surface of the emitter 26. The remaining features are similar to that already described with respect to FIG. 1.

FIGS. 5A-5D show fabrication processes of forming the heterojunction bipolar transistors of FIGS. 1-3 in accordance with aspects of the present disclosure. More specifically, FIG. 5A shows the subcollector 14 within the semiconductor substrate 12, and hardmask material over the subcollector 14. In embodiments, the subcollector 14 may be formed by an ion implantation process that introduces a concentration of a dopant into the semiconductor substrate 12.

By way of example of forming the subcollector 14, a patterned implantation mask may be used to define selected areas exposed for the implantations. The implantation mask may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. An annealing process may be performed to drive in the dopant into the semiconductor substrate 12. The subcollector 14 may be highly doped with n-type dopants, e.g., Arsenic (As), Phosphorus (P) and Sb, among other suitable examples.

Still referring to FIG. 5A, hardmask materials 16, 18, 20 may be formed over the subcollector 14. In embodiments, the hardmask materials 16, 18, 20 may be a combination of nitride and oxide, deposited by conventional CVD processes. In embodiments, a single hardmask material is also contemplated by the present disclosure.

A trench 21 is formed within the semiconductor substrate 12 and hardmask materials 16, 18, 20. In embodiments, the trench is formed by conventional lithography, and etching methods known to those of skill in the art. For example, a resist formed over the hardmask material 20 is exposed to energy (light) to form a pattern (opening). An etching process with a selective chemistry, e.g., reactive ion etching (RIE), will be used to transfer the pattern from the patterned photoresist layer to the semiconductor substrate 12 and the hardmask materials 16, 18, 20 to form the trench 21 in these materials through the openings of the resist. The resist may be removed by a conventional oxygen ashing process or other known stripants.

In FIG. 5B, the collector 22, intrinsic base 24, emitter 26, optional marker layer 28 and extrinsic base material 30a may be formed using a single epitaxial growth pass, i.e., without any intervening processing steps. That is, unlike in conventional processes, the epitaxial growth process is not performed in multiple passes with intervening fabrication processing steps. In embodiments, the epitaxial growth process may be performed in a single pass in a same chamber, as an example. By using a single pass with no intervening fabrication processing steps, it is now possible to clean the surface of the semiconductor materials a single time prior to the epitaxial growth process, hence saving considerable time and costs. The surface cleaning step may be a pre-epitaxial wet cleaning process to limit defect. For example, the pre-epitaxial wet cleaning process may be performed with an HF solution.

Still referring to FIG. 5B, the collector 22 may be formed in the trench 31 using a selective epitaxial growth process. In embodiments, the epitaxial growth process may include an in-situ doping to form an N– subcollector. The doping may also be auto-doped as is known in the art using n-type dopants. In embodiments, the collector 22 may be grown to a surface of the hardmask material 20, e.g., planar with the hardmask material 20.

The intrinsic base 24 may be formed over the collector 22 by a controlled epitaxially growth process, which results in a slight overlap or lateral growth onto the hardmask 20. In this way, the collector 22 and intrinsic base 24 may have a different shape. In embodiments, the overlap or lateral overgrowth of the intrinsic base 24 onto the hardmask 20 may be provided by adjusting the temperature and/or pressure and/or gas flow of the epitaxial growth process as is known in the art. For example, an increase in the temperature and pressure may result in such overlap onto the hardmask 20. The intrinsic base 24 may be SiGe material with a Ge concentration of greater than 15%.

The emitter 26 may be epitaxially grown over the intrinsic base 24. In embodiments, the epitaxial growth process may be a non-selective epitaxial growth process. In embodiments, the emitter 26 may be N+ semiconductor material, e.g., N+ Si, which may be formed by an in-situ doping process using n-type dopants during the epitaxial growth process. For example, the n-type dopant may be phosphorus or arsenic. In embodiments, there should preferably be no lateral overgrowth of the emitter material onto the hardmask 20, hence it being constrained to the surface of the intrinsic base 24. In embodiments, the shape of the emitter 26 may be different than the shape of the intrinsic base 24.

The optional marker layer 28 may be formed by a non-selective epitaxial growth process over the emitter 26 and the hardmask 20. In embodiments, the non-selective epitaxial growth process may be provided by, for example, adjusting gases within the epitaxial chamber. As should be understood by those of skill in the art, the optional marker layer 28 may form polycrystalline over the hardmask 20 and a single crystalline over the emitter 26. In embodiments, the optional marker layer 28 may be SiGe with a Ge concentration of less than 15% and, more preferably, about 5% to 15%.

In embodiments, extrinsic base material 30a may be epitaxially grown over the marker layer 28. In processes in which the optional marker layer is not used, the extrinsic base material 30a may be epitaxially grown directly on the hardmask 20. In either scenario, the epitaxial growth process is a non-selective growth process forming a polysilicon material and, more specifically, a P+ polysilicon material over either the optional marker layer 28 or hardmask 20. The extrinsic base material 30a may be subjected to a planarization process, e.g., chemical mechanical polishing (CMP).

As shown in FIG. 5C, a capping material 29 may be formed over the extrinsic base material 30a. The capping material 29 may be a nitride material deposited by a conventional CVD process. A patterning process may be performed to form the extrinsic base 30 and the emitter 26. In this patterning process, the extrinsic base 30 will be laterally adjacent to and in contact with a side of the intrinsic base 24, while electrically isolated from the emitter 26.

The patterning process may also form the trenches 31. For example, the patterning process may form the trenches 31 between the extrinsic base 30a and the emitter 26 to electrically isolate the extrinsic base 30a and the emitter 26 to ensure that there are no conductive shorts. The trenches 31 are patterned to overlap or straddle the collector 22 and the hardmask 20. The patterning process may be conventional lithography and etching processes as already described herein such that no further explanation is required for a complete understanding of the present disclosure. It should also be recognized by those of skill in the art that the patterning process, e.g., formation of the trenches 31, may remove any defective material of the emitter 26, extrinsic base 30 and intrinsic base 24 that resulted from the epitaxial growth process. In further embodiments, the marker layer 28 may be used as an etch stop layer for the formation of the trenches 31.

Figure 5D:
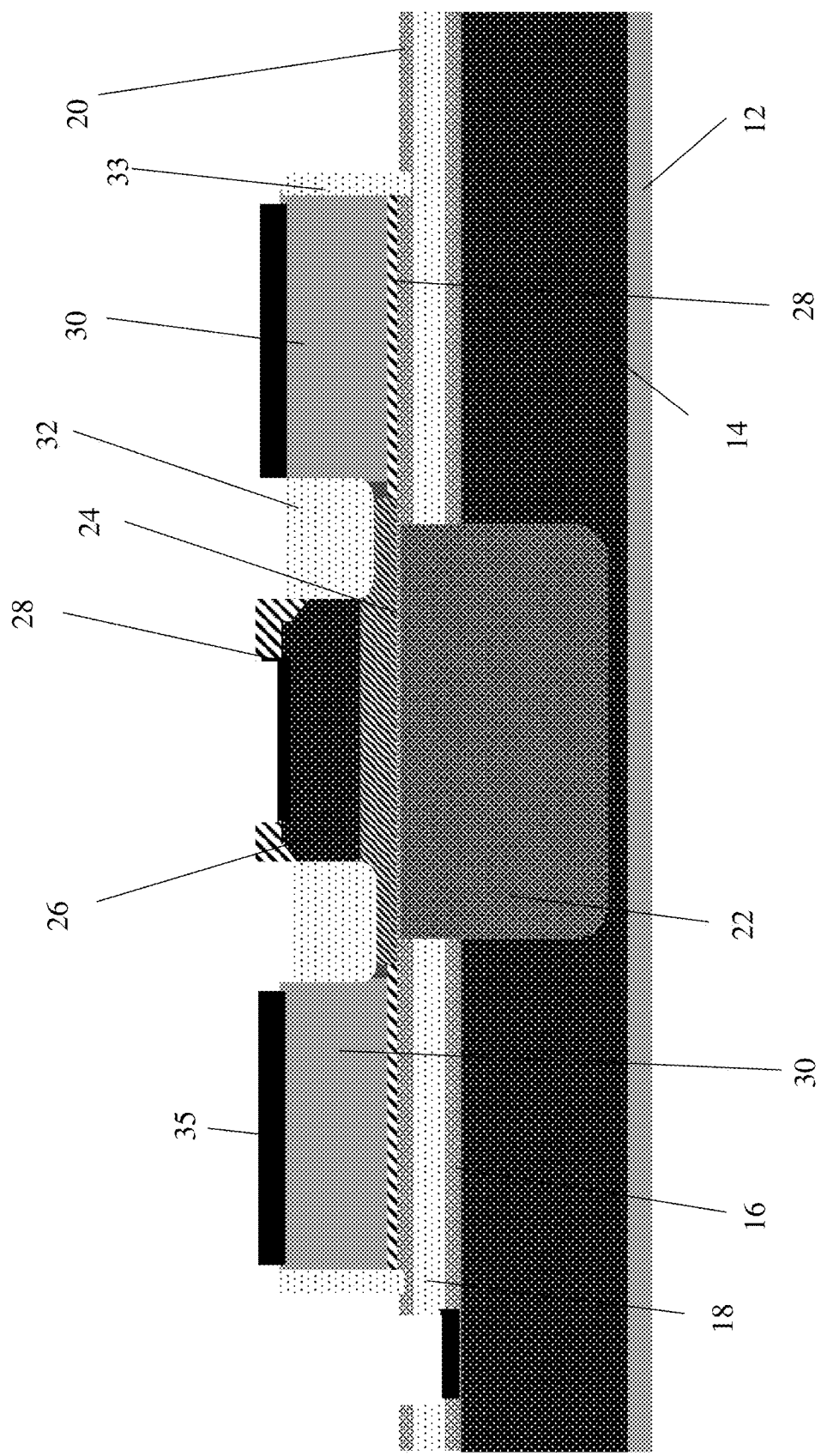

In FIG. 5D, dielectric material 32, e.g., oxide, may be formed within the trenches 31. In embodiments, the dielectric material 32 may be formed by a blanket deposition process, e.g., CVD, followed by an anisotropic etching process. The anisotropic etching process may recess the dielectric material 32 within the trenches 31, in addition to forming sidewall spacers 33 on opposing sides of the extrinsic base 30. In addition, the anisotropic etching process may remove the capping material. Alternatively, the capping material may remain over the emitter 26 and extrinsic base 30, depending on the thickness of the capping material.

Following the etching process, a silicide contact 35 may be formed on the extrinsic base 30, emitter 26 and subcollector 14. In embodiments, the silicide contact 35 may be formed prior to or after formation of the interlevel dielectric material 34 as shown in FIG. 1. By way of example, after exposing regions of the emitter 26 and subcollector 14 (and the extrinsic base 30 when an interlevel dielectric material is already deposited) by conventional lithography and etching processes, a thin transition metal layer, e.g., nickel, cobalt or titanium, may be deposited over the semiconductor material. After deposition of the material, the structure is heated allowing the transition metal to react with exposed semiconductor material forming a low-resistance transition metal silicide 35. Following the reaction, any remaining transition metal is removed by chemical etching, leaving silicide contact 35 in the active regions of the device.

As further represented by the structure shown in FIG. 1, an interlevel dielectric material 34 may be formed, e.g., deposited, over the dielectric material 32, the extrinsic base 30, the emitter 26 and the optional marker layer 28. In embodiments, the interlevel dielectric material 34 may be alternating layers of oxide and nitride, as an illustrative example, deposited by conventional CVD processes. Trenches are formed within the interlevel dielectric material 34 (and where applicable the marker layer 28 and hardmask materials 16, 18 20) to expose the silicide contacts 35 of the extrinsic base 30, emitter 26 and subcollector 14. The trenches may be formed by conventional lithography and etching processes. A conductive material, e.g., tungsten with a TaN or TiN liner, may be deposited within the trenches, followed by a conventional CMP process to remove any excessive material from the interlevel dielectric material 34.

Figure 6A:
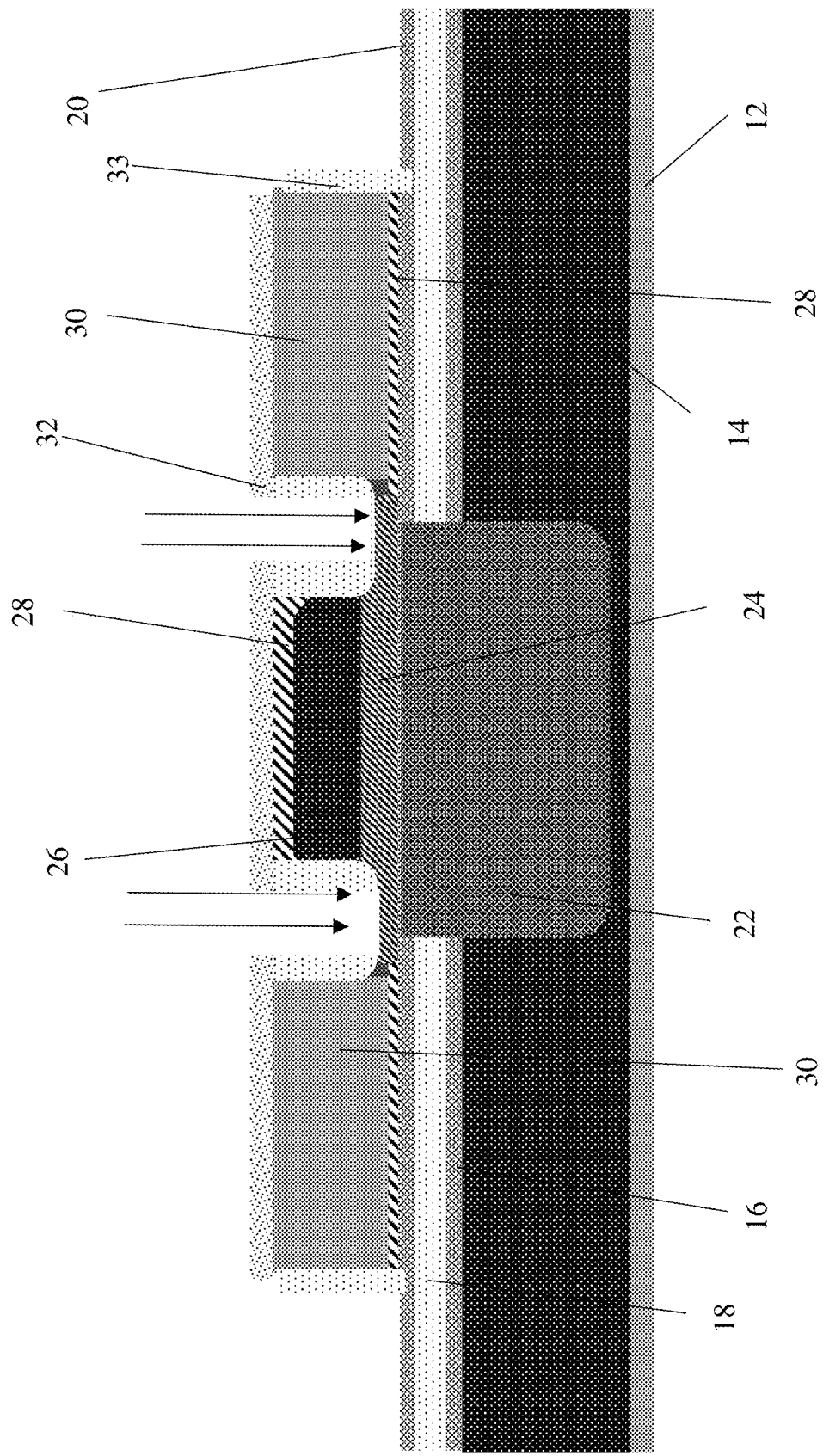
FIGS. 6A and 6B show fabrication processes of forming the heterojunction bipolar transistor of FIG. 4 in accordance with aspects of the present disclosure.
Figure 6B:
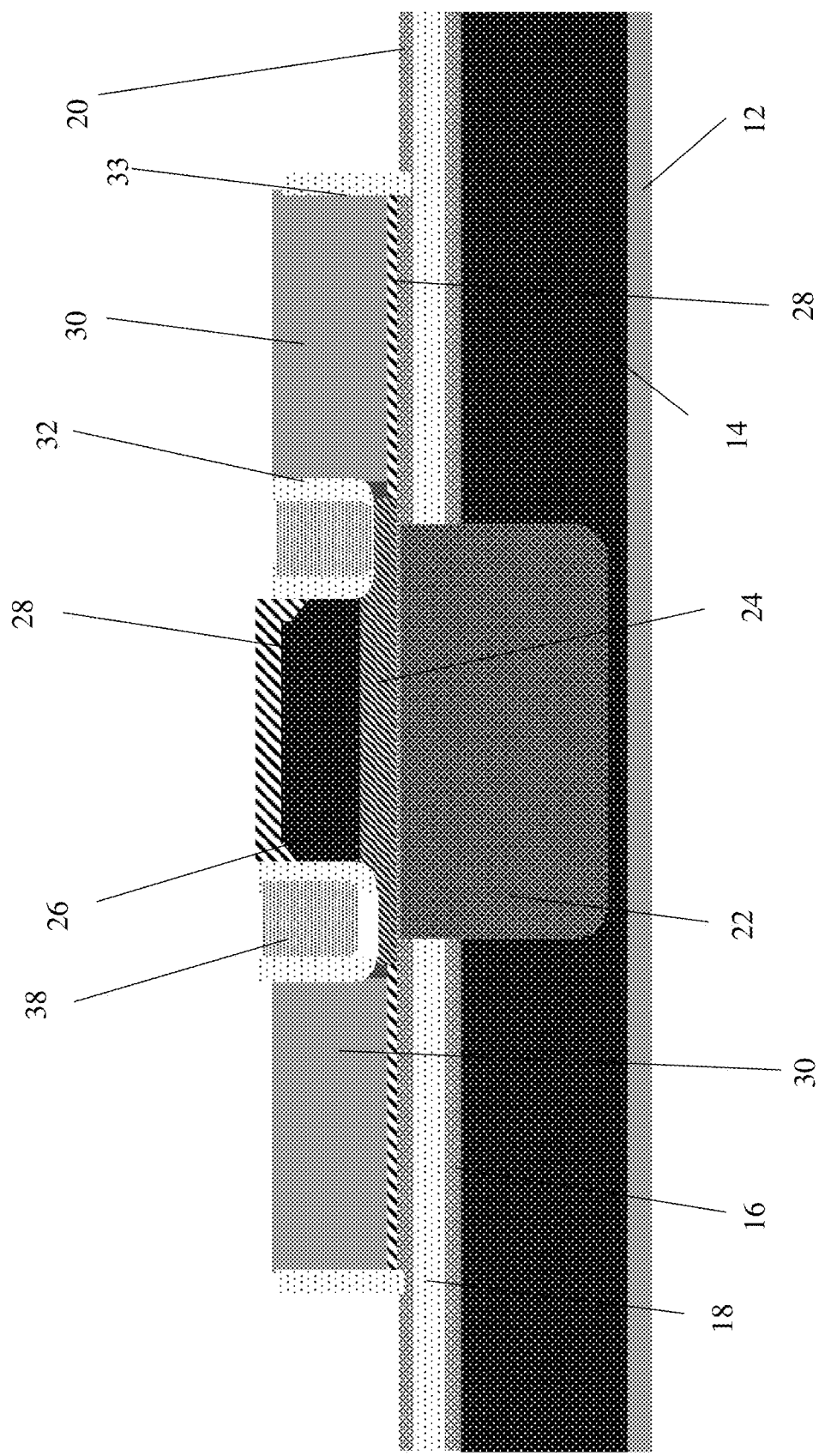

FIGS. 6A and 6B show fabrication processes of forming the heterojunction bipolar transistor of FIG. 4 in accordance with aspects of the present disclosure. In these fabrication process, after formation of the trenches 31, a dielectric material 32 may be deposited over the structure and within the trenches 31 to form sidewall spacers as is known in the art. A dopant may be introduced into intrinsic base 24 through the open space of the trenches 31, e.g., between the sidewall spacers, using an implant process. In this process, the capping layer may be used as a blocking mask during the implant process. The implant may be p-type implant, e.g., boron, to provide a link up to the extrinsic base 30. In further embodiments, the implant may include Ge and/or C to reduce the concentration of boron. In alternative embodiments, a deposition of borosilicate glass (BSG) layer may be deposited within the trench 31 followed by an annealing process to link the boron to the extrinsic base 30.

In FIG. 6B, a dielectric material 38 can be deposited within the remaining portions of the trench 31. The processes can continue with the steps shown in FIG. 5D and FIG. 1.

The heterojunction bipolar transistors can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a collector in a semiconductor substrate;
    a subcollector in the semiconductor substrate;
    an intrinsic base over the subcollector;
    an extrinsic base adjacent to the intrinsic base;
    an emitter over the intrinsic base;
    an isolation structure between the extrinsic base and the emitter and which overlaps the subcollector; and
    a marker layer underneath the extrinsic base and which also covers an upper surface of the emitter.

2. The structure of claim 1, further comprising a hardmask underneath the extrinsic base.

3. The structure of claim 2, wherein the hardmask comprises at least one insulator material located between the extrinsic base and the collector and the intrinsic base laterally extends onto an upper surface of the hardmask.

4. The structure of claim 2, wherein the isolation structure overlaps both the hardmask underneath the extrinsic base and the subcollector.

5. The structure of claim 2, wherein the collector is in a trench extending into the semiconductor substrate and the hardmask.

6. The structure of claim 1, wherein the extrinsic base contacts a side of the intrinsic base over a hardmask material.

7. The structure of claim 1, wherein the intrinsic base comprises a doped material below the isolation structure.

8. The structure of claim 7, wherein the isolation structure comprises sidewall spacers and a second material filling a space between the sidewall spacers, and the doped material is below the second material.

9. A structure comprising:
    a collector in a semiconductor substrate;
    a subcollector in the semiconductor substrate;
    an intrinsic base over the subcollector;
    an extrinsic base adjacent to the intrinsic base;
    an emitter over the intrinsic base;
    an isolation structure between the extrinsic base and the emitter and which overlaps the subcollector; and
    a marker layer underneath the extrinsic base, wherein the marker layer and the intrinsic base both comprises SiGe, and a Ge concentration of the marker layer is lower than a Ge concentration of the intrinsic base.

10. A structure comprising:
    a collector;
    a subcollector electrically connected to the collector;
    an intrinsic base over the subcollector;
    an extrinsic base adjacent to the intrinsic base;
    a hardmask between the collector and the extrinsic base;
    an emitter over the intrinsic base, and
    a marker layer between the hardmask and the extrinsic base.

11. The structure of claim 10, wherein the marker layer covers an upper surface of the emitter.

12. The structure of claim 10, further comprising an isolation structure between the extrinsic base and the emitter and which overlaps both the subcollector and the hardmask.

13. The structure of claim 12, wherein the isolation structure comprises sidewall spacers and a second material filling a space between the sidewall spacers.

14. The structure of claim 10, wherein the collector is in a trench.

15. The structure of claim 10, wherein the extrinsic base contacts a side of the intrinsic base.

16. The structure of claim 10, wherein the intrinsic base laterally extends onto a surface of the hardmask.

17. A method comprising:
    forming a collector in a semiconductor substrate;
    forming a subcollector in the semiconductor substrate;
    forming an intrinsic base over the subcollector;
    forming an extrinsic base adjacent to the intrinsic base; and forming an emitter over the intrinsic base; and
forming an isolation structure between the extrinsic base and the emitter and which overlaps the subcollector, wherein
the collector, the intrinsic base, the emitter and the extrinsic base are formed in a single epitaxial growth process.

* * * * *